United States Patent [19]

Arai et al.

[11] Patent Number: 5,066,171
[45] Date of Patent: * Nov. 19, 1991

[54] METHOD FOR DRILLING A PRINTED CIRCUIT BOARD

[75] Inventors: Kunio Arai, Atsugi; Hiromi Nishiyama, Ebina; Hiroshi Aoyama, Tokyo; Yasuhiko Kanaya, Machida, all of Japan

[73] Assignee: Hitachi Seiko Ltd., Tokyo, Japan

[*] Notice: The portion of the term of this patent subsequent to Oct. 10, 2006 has been disclaimed.

[21] Appl. No.: 324,769

[22] Filed: Mar. 17, 1989

Related U.S. Application Data

[63] Continuation-in-part of Ser. No. 106,439, Oct. 9, 1987, Pat. No. 4,872,787.

Foreign Application Priority Data

Dec. 19, 1986 [JP] Japan ............... 61-301285

[51] Int. Cl.$^5$ .................................. B23B 35/00
[52] U.S. Cl. ........................ 408/1 R; 408/17; 408/95
[58] Field of Search ............ 408/1 R, 17, 95, 97

[56] References Cited

U.S. PATENT DOCUMENTS

| | | | |
|---|---|---|---|
| 2,768,539 | 10/1956 | Wollenhaupt et al. | 408/17 |
| 3,129,613 | 4/1964 | Burg | 408/17 |
| 3,637,318 | 1/1972 | Hayes | 408/17 |
| 4,123,188 | 10/1978 | Deremo et al. | 408/17 |
| 4,212,570 | 7/1980 | Larsson | 408/95 |
| 4,269,549 | 5/1981 | Block | 408/1 R |
| 4,311,419 | 1/1982 | Block | 408/1 R |
| 4,872,787 | 10/1989 | Arai et al. | 408/95 |

FOREIGN PATENT DOCUMENTS

| | | | |
|---|---|---|---|
| 205209 | 11/1984 | Japan | 408/95 |
| 2019269 | 10/1979 | United Kingdom | 408/95 |

Primary Examiner—Daniel W. Howell
Attorney, Agent, or Firm—Antonelli, Terry, Stout & Kraus

[57] ABSTRACT

In a method of and an apparatus for drilling a hole in a workpiece, a pressure foot associated with a drill is moved into contact with the workpiece, and a drill bit associated with the drill is moved from a drill-starting position into the workpiece, toward the drill-starting position and again into the workpiece while maintaining the pressure foot in constant contact with the workpiece. The drill is reciprocally fed by a plurality of times under the pressure of the pressure foot acting upon the printed circuit board. In either of the method and the apparatus, a hole with a high aspect ratio can be formed in a workpiece made from a thin, flexible material.

10 Claims, 11 Drawing Sheets x 25

DEVIATION OF HOLE POSITION ON
FRONT FACE OF UPPERMOST PC BOARD

Ave.  ±60 μm x 25

DEVIATION OF HOLE POSITION ON
REAR FACE OF LOWEST PC BOARD

Ave.  ±60 μm

DEFORMATION OF COPPER FOIL
DUE TO CLOGGING ; LARGE x 200

× 50

×25

DEVIATION OF HOLE POSITION ON FRONT FACE OF UPPERMOST PC BOARD

Ave.    ±20 μm

×25

DEVIATION OF HOLE POSITION ON REAR FACE OF LOWEST PC BOARD

Ave.    ±30 μm

DEFORMATION OF COPPER FOIL DUE TO CLOGGING ; SMALL

×200 x 50

RELATIONSHIP BETWEEN No. OF HOLES AND DRILL BIT WEAR FOR DIFFERENT DRILLING METHODS

RELATIONSHIP BETWEEN No. OF HOLES AND DRILLED HOLE ACCURACY FOR DIFFERENT DRILLING METHODS

RELATIONSHIP BETWEEN No. OF HOLES AND SMEAR GENERATION RATIO FOR DIFFERENT DRILLING METHODS

METHOD FOR DRILLING A PRINTED CIRCUIT BOARD

CROSS-REFERENCE TO RELATED APPLICATION p This is a CONTINUATION IN PART of Application Ser. No. 106439 filed on Oct. 9, 1987, now U.S. Pat. No. 4,872,787.

BACKGROUND OF THE INVENTION

1. Field of the Invention

The present invention relates to a method of and an apparatus for drilling a printed circuit board by means of a drill.

2. Description of the Related Art

In general, printed circuit boards are drilled by using a drill.

For example, the essential portion of an apparatus for drilling printed circuit boards is constructed as shown in FIG. 1. (For further detail, refer to commonly assigned Japanese Patent Application Laid-Open No. 205209/1984).

As illustrated, a chuck 101a is supported at one end of a spindle 101. A cylinder 103 is disposed for movement along its axis and supports the spindle 101 for rotation about its, axis. A slide portion 103a is formed between the spindle 101 and the cylinder 103. A piston 104 is supported by the slide portion 103a in such a manner that it can move along the axis of the spindle 101. A space 115 defined by the spindle 101, the cylinder 103 and the piston 104 is supplied with compressed air under fixed pressure from a compressed-air source (not shown) through a fluid conduit 116.

A pressure foot 5 having a hole 6 connected to a dust collector is fixed to one end of the piston 104.

A drill 4 is supported by the chuck 101a.

A plurality of printed circuit boards 1 which are to be drilled by such an apparatus for drilling printed circuit boards are stacked. The stack of the printed circuit boards 1 is sandwiched between an entry board 2 and a back-up board 3, and they are integrally fixed.

As shown in FIG. 2, when the spindle 101 is moved toward the stacked printed circuit boards 1, the pressure foot 5 first comes into contact with the entry board 2. When the spindle 101 is further moved toward the stacked printed circuit boards 1, the entry board 2, the stacked printed circuit boards 1 and the back-up board 3 are pressed by the pressure foot 5 under the pressure supplied to the space 115 since the movement of the pressure foot 5 is restricted by the contact with the entry board 2.

When, in this state, the spindle 101 is further moved toward the stacked printed circuit boards 1, the tip of the drill 4 engages with the entry board 2 and initiates drilling. Subsequently, the spindle 101 is moved to a point at which the tip of the drill 4 penetrates into the back-up board 2, thus completing drilling of the stacked printed circuit boards 1.

In such a drilling method, if one back-up board 3 having a thickness of 0.063 inches, three printed circuit boards 1 each having a thickness of 0.063 inches and one entry board 2 having a thickness of 0.04 inches are integrally fixed and a hole is drilled to a depth of 0.04 inches in the back-up board 3 from the surface thereof opposing the entry board 2, the total depth of the hole is 0.269 inches.

If the diameter of a hole to be drilled is, for example, 0.047 inches, the resultant aspect ratio (the ratio of the depth Lh of the hole and the diameter D) is 5.7.

When the aspect ratio is relatively small (not greater than 6) as described above, the drill 4 can be fed from a drill-starting position A to a drill end position B to drill the stacked printed circuit boards 1.

However, if the diameter D of a hole to be drilled is, for example, 0.031 inches, the resulting aspect ratio is 8.7.

When the aspect ratio is large as described above, it is impossible to effect drilling by feeding the drill 4 from the drill-starting position A over to the drill end position B in one step.

In other words, when the aspect ratio is excessively large, it is difficult to eliminate debris produced during drilling and such debris clogs the flute of the drill 4. As a result, the following problems may occur:

1. The surface roughness of the inner circumferential wall of a drilled hole increases.

2. The amount of heat generated due to friction during drilling becomes large and the temperature of the drill 4 rises to an excessive degree. Therefore, the thermal wear of the drill 4 increases.

3. The base material (for example, an epoxy resin) of each printed circuit board 1 melts due to the temperature rise in the drill 4, and thus even larger amounts of smears stick to, and hardens on, the end surface of a copper foil exposed in the inner circumferential wall of the drilled hole.

4. Further, a load applied to the drill 4 increases, and the drill 4 may be easily broken.

Accordingly, a proposal has been made to make a hole having a large aspect ratio, as shown in FIG. 3.

For example, the distance between the drill-starting position A and the drill end position B is divided into three stages with intermediate positions M1 and M2 set partway down the hole.

The feed rate of the drill is selected between a drilling feed rate VF and a rapid feed rate VR.

First, the drill is fed from the drill-starting position A to the first intermediate position M1 at the drilling feed rate VF. Then, the drill is fed from the intermediate position M1 to the drill-starting position A at the rapid feed rate VR. Subsequently, the drill is fed from the drill-starting position A to the intermediate position M1 at the rapid feed rate VR. When the tip of the drill reaches the intermediate position M1, the feed rate of the drill is switched from the rapid feed rate VR to the drilling feed rate VF. Then, the drill is fed from the intermediate position M1 to the second intermediate position M2, then from the intermediate position M1 back to the drill-starting position A at the rapid feed rate VR. Then, the drill is fed from the drill-starting position A to the intermediate position M2 at the rapid feed rate Vx. When the tip of the drill reaches the intermediate position M2, the feed rate of the drill is switched from the rapid feed rate VR to the drilling feed rate Vr. Then, the drill is fed from the intermediate position M2 to the drill end position B. After the drill has reached the drill end position B, the drill is fed from the drill end position B back to the drill-starting position A at the rapid feed rate VR.

Since the drill is fed reciprocally between the drill-starting position A and the intermediate positions M1, M2 to effect drilling, the following advantages can be obtained:

1. Chips filling the drill flute are shaken off when the drill is located out of the entry board. Therefore, the problems caused by chip clogging are eliminated.

2. The drill is cooled when the drill is located out of the entry board. Therefore, it is possible to reduce the thermal wear of the tip of the drill.

Such a method of drilling a hole by reciprocally feeding a drill is disclosed in, for example, U.S. Pat. Nos. 2,768,539, 3,129,613, 3,637,318, and 4,123,188.

However, none of the above patents disclose the use of the pressure foot required to drill a hole in a printed circuit board.

In other words, none of the above prior arts suppose drilling of soft workpieces such as printed circuit boards.

In general, in the case of drilling printed circuit boards, the entry board or the printed circuit boards exhibit softness. The pressure foot is connected to a dust collector and a vacuum is produced in the space in the pressure foot during drilling. Thus, the space is always maintained at a negative pressure during drilling.

Accordingly, each time the spindle is fed upwardly, the entry plate is pulled upwardly by the negative pressure in the pressure foot. Therefore, stresses due to the repetition of the upward pulling and recovery are produced in the entry plate and, while a multiplicity of holes are being drilled, wear occurs in the fixed parts of the entry plate and the entry plate may be displaced horizontally. If the entry plate is displaced, the position of the hole which has been formed in the entry plate when drilling has reached the initial intermediate position M1 is deviated from the entry position of the drill when the next drilling to the intermediate position M2 is initiated Accordingly, if the drill is reciprocally fed by a plurality of times during drilling of one hole, the number of times by which the entry plate makes contact with the drill increases, and the amounts of wear and bending of the drill increase. As a result, the following problems shown in FIGS. 4A to 4D will be encountered:

1. The positional accuracy of the hole and the configuration of the hole is degraded (refer to FIGS. 4A and 4C).

2. The amounts of smears sticking to the inner wall of the hole increases (refer to FIG. 4B).

3. The extent of deformation of the copper foil of the printed circuit board before drilling increases (refer to FIG. 4D).

For example, U.S. Pat. Nos. 4,212,570, 4,340,326 disclose the use of such a pressure foot.

However, none of the last-mentioned patents disclose the method of effecting drilling by feeding the drill reciprocally.

In other words, these patents suppose that a hole is drilled in stacked printed circuit boards in one step.

As is well known, the packaging density of electronic parts on a printed circuit board has been increasing. In such a situation, it is desired that the line width of a wiring pattern formed on a printed circuit board be reduced to 0.04 inches or less. Accordingly, it is demanded that the diameters of holes formed in the printed circuit board be made extremely small, for example, 0.016 inches or less. As a result, an increase in an aspect ratio cannot be avoided and it has become difficult to complete drilling in one step.

Since a drilling method such as that shown in FIG. 3 involves the step of feeding the drill from the drill end position B back to the drill-starting position A for the purpose of achieving reciprocal feeding of the drill, it has been impossible to avoid the problem that the time period required to drill one hole becomes long and the efficiency of working is consequently deteriorated.

For example, there is a case where several thousands to some tens of thousands holes are drilled in a single printed circuit board. In such a case, if the time period required to drill each hole is extended by 0.1 seconds, then the total time period for drilling each printed circuit board becomes longer by several minutes to several hours.

In general, printed circuit boards are manufactured through a multiplicity of steps such as (1) drilling, (2) through-hole copper plating, (3) patterning, (4) etching and stripping, (5) printing for solder resist, (6) gold plating on contact fingers, (7) solder coating, (8) press for blanking and finishing, (9) electrical inspection, (10) final inspection, (11) flux coating, (12) shipment, and (13) mounting. The drilling step is the first step in the process for manufacturing printed circuit boards.

Accordingly, since an error in drilling and the quality of a drilled hole may influence all the subsequent steps, the development of high precision and high grade drilling is demanded.

SUMMARY OF THE INVENTION

It is, therefore, an object of the present invention to provide a method of and an apparatus for drilling a hole of large aspect ratio in a printed circuit board with high efficiency.

It is another object of the present invention to provide a method of and an apparatus for drilling a hole of large aspect ratio in a printed circuit board with the position of the hole and the configuration thereof maintained with high precision and high grade.

To achieve the above objects, in accordance with one aspect of the present invention, there is provided a method for drilling a hole in a workpiece which comprises the steps of moving a pressure foot associated with a drill into contact with the workpiece, and moving a drill bit associated with the drill from a drill-starting position into the workpiece, toward the drill-starting position and again into the workpiece while maintaining the pressure foot in constant contact with the workpiece.

In accordance with another aspect of the present invention, there is provided an apparatus for drilling a hole in a workpiece, which includes a device for moving a pressure foot associated with a drill into a position to exert pressure on the workpiece and a device for moving a drill bit associated with the drill from a drill-starting position into the workpiece, then toward the drill-starting position and again into the workpiece while maintaining the pressure exerted on the workpiece by the pressure foot.

The present invention is characterized in that the drill is reciprocally fed by a plurality of times with the pressure of the pressure foot acting upon stacked printed circuit boards.

DETAILED DESCRIPTION OF THE PREFERRED EMBODIMENTS

Preferred embodiments of the present invention will be described below with reference to the accompanying drawings.

Figure 1:
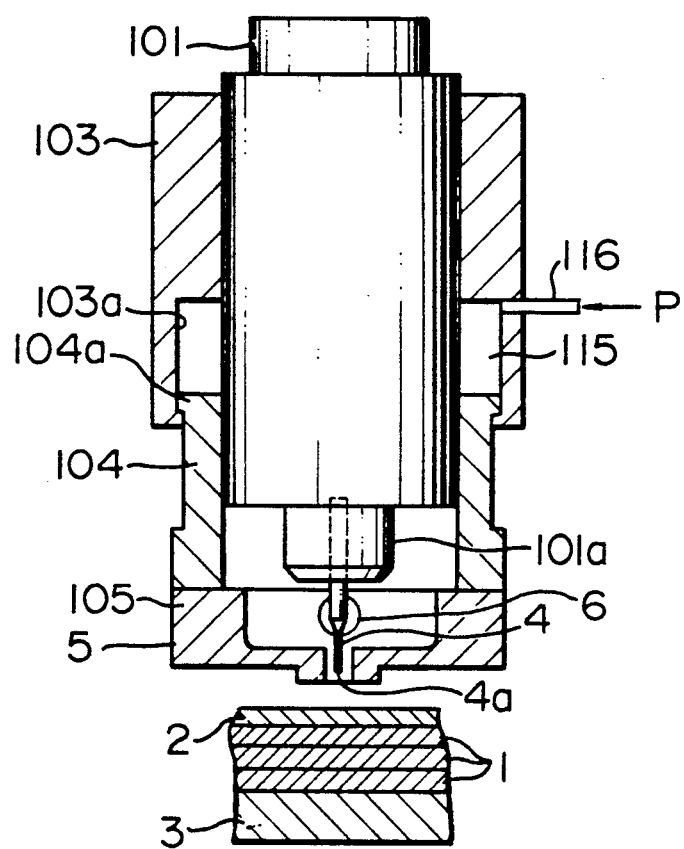
FIG. 1 is a front elevational view in partial cross section of the positional relationship between a drill and a pressure foot in a printed-circuit-board drilling machine to which the present invention is applied.
Figure 2:
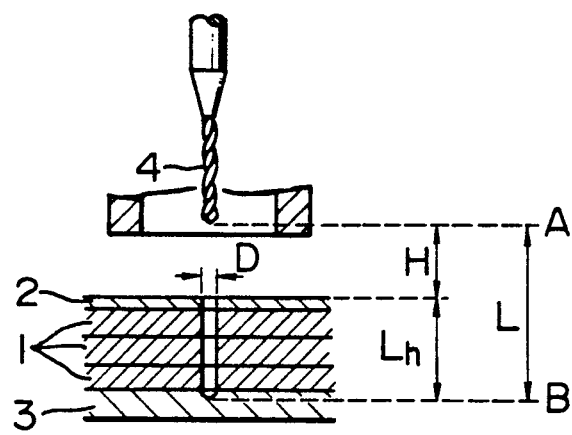
FIG. 2 is a front elevational view in partial cross section of the state of a hole drilled in stacked printed circuit boards.
Figure 3:
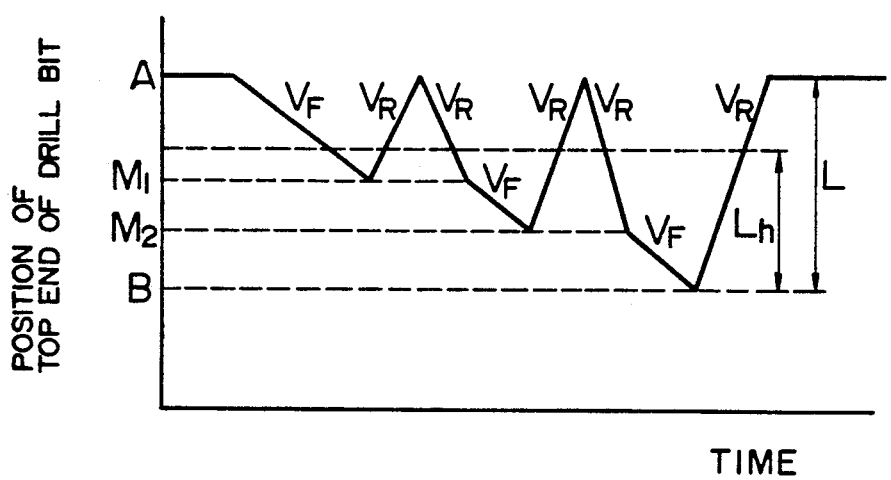
FIG. 3 is a characteristic chart showing the relationship between the position of a drill and the time for the drill to be fed in a conventional drilling method.
Figure 4A:
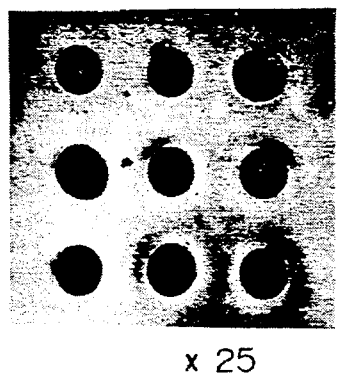
FIG. 4A illustrates the result of drilling of printed circuit boards using the conventional drilling method, and shows the state of, the front face of the uppermost printed circuit board.
Figure 4C:
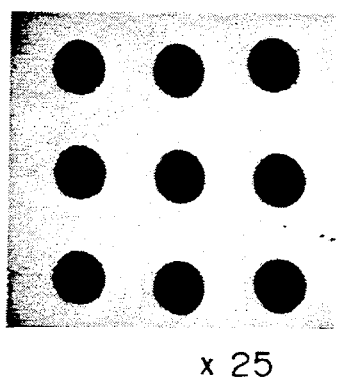
FIG. 4C illustrates the result of drilling of the printed circuit boards using the conventional drilling method, and shows the state of the rear face of the lowermost printed circuit board.
Figure 4D:
FIG. 4D is an enlarged view of the upper end of the hole shown in FIG. 4B.
Figure 4B:
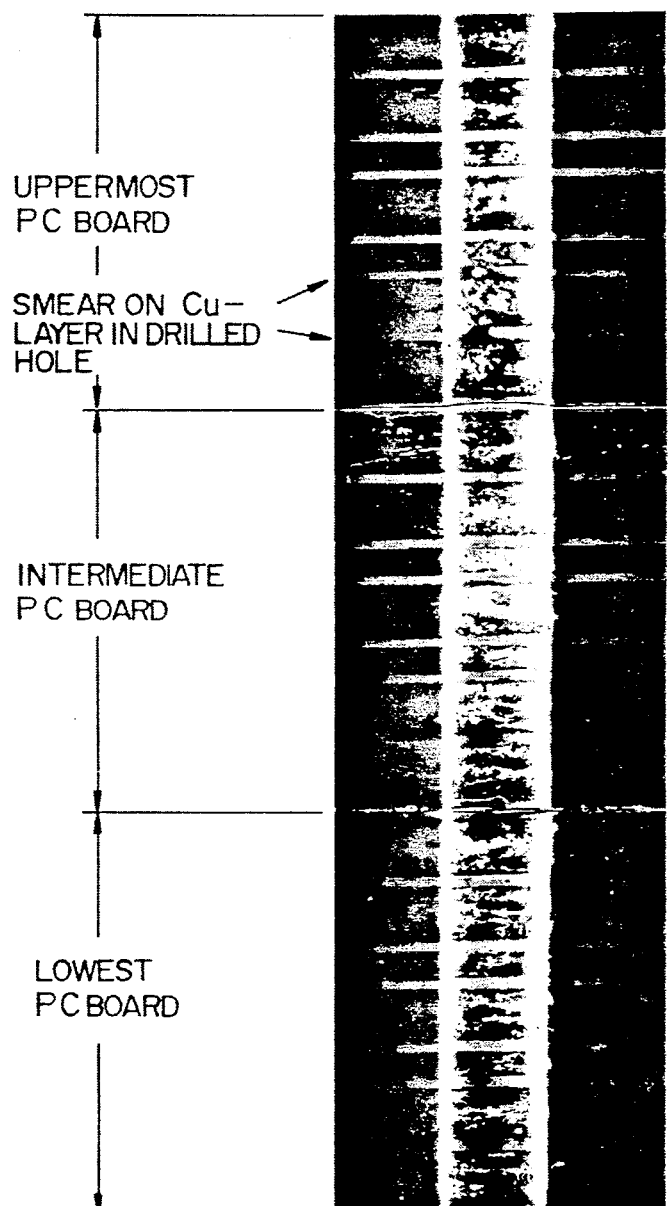
FIG. 4B is a cross-sectional view illustrating the result of drilling of the printed circuit boards using the conventional drilling method.
Figure 5:
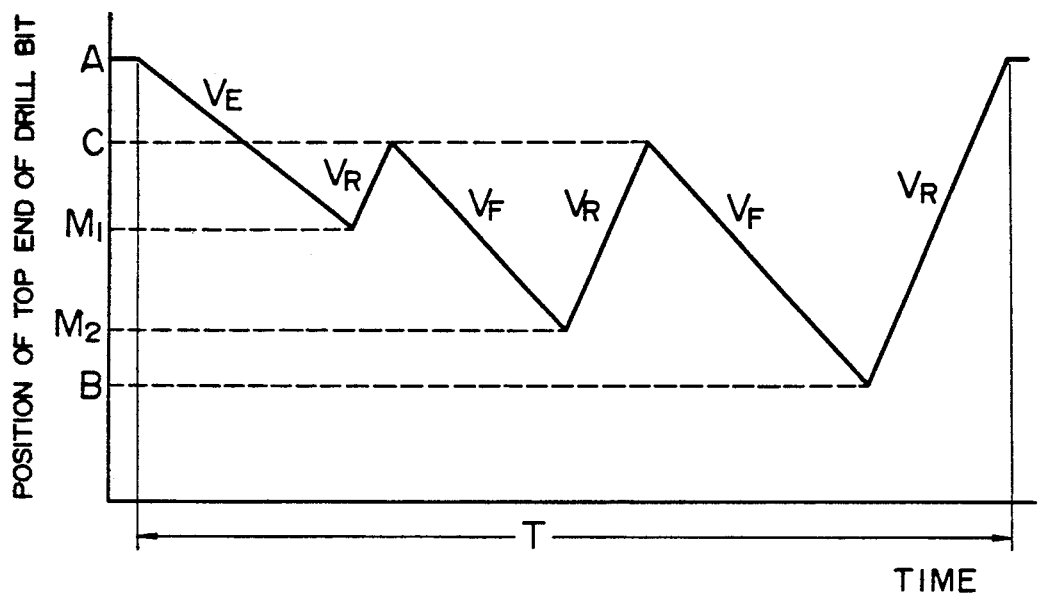
FIG. 5 is a characteristic chart showing the relationship between the position of a drill and the time for the drill to/be fed in accordance with a first aspect of the present invention.
Figure 6:
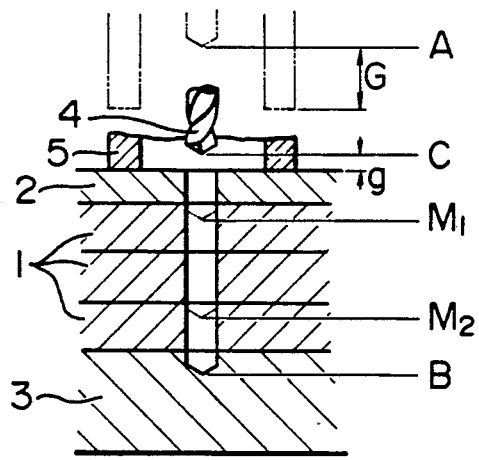
FIG. 6 is a front elevational view in partial cross section of the state of a hole drilled in stacked printed circuit boards in accordance with the first aspect.

FIGS. 5 and 6 show a first embodiment of the present invention.

As illustrated in FIG. 6, printed circuit boards are indicated at 1, and an entry board and a back-up board are indicated at 2 and 3, respectively. The printed circuit boards 1, the entry board 2 and the back-up board 3 are stacked and integrally fixed. A drill and a pressure foot are indicated at 4 and 5, respectively. The pressure foot 5 is supported for movement along the axis of the drill 4. The pressure foot 5 is urged downwardly.

Symbol A represents a drill-starting position at which the pressure foot 5 is located away from the entry board 2. In this state, a gap G is formed between the tip end of the drill 4 and the adjacent end of the pressure foot 5. The gap G is selected to be 0.06 to 0.1 inches.

Symbol B represents a drill end position which is selected so that the tip of the drill 4 penetrates into the back-up board 3 to a depth of approximately 0.04 inches.

Symbol C represents a pulled-out position at which the pressure foot 5 is maintained in contact with the entry board 2 and at which the tip end of the drill 4 is located immediately above the entry board 2. In this state, a gap g is formed between the tip end of the drill 4 and the adjacent end of the pressure foot 5. Accordingly, when the tip end of the drill 4 is located at the pulled out position C, the pressure of the pressure foot 5 acts upon the entry board 2 owing to the difference between the gap G and the gap g. The pulled-out position C is preferably selected so that, when the gap g is in the range of 0.02–0.06 inches, the relationship between the gap G and the gap g may be G>g.

Symbols M1 and M2 represent intermediate positions which are arranged in that order in the direction of the depth of a hole. The intermediate position M1 is set at a location where the tip end of the drill 4 penetrates into at least the uppermost printed circuit board 1.

The intermediate position M1 is set at a location 0.06–0.08 inches lower than a top surface S of the entry board 2, and the intermediate position M2 is set at a location 0.04–0.06 inches lower than the intermediate position M1. (If an even deeper hole is to be drilled, the distance between an intermediate position Mn−1 and the intermediate position Mn is selected to be 0.02–0.04 inches.) The distance between the intermediate position M2 (Mn) and the drill end position B is selected to be 0.02–0.04 inches.

Symbol VE represents an entry feed rate which is set at a rate which ensures that the drill 4 penetrates into the entry 2 and the stacked printed circuit board 1. The entry feed rate VE is selected to be 60–100 ipm.

Symbol VF represents a drilling feed rate which is set at a proper rate which ensures that the drilled hole is of optimum quality. The drilling feed rate VF is selected to be 40–60 ipm:

Symbol VR represents a rapid feed rate which is set at a proper rate which ensures that the quality of the drilled hole is not lowered. The rapid feed rate VR is set at 1000 ipm.

Drilling conditions suitable for the type of printed circuit boards 1 to be drilled are selected from among the above-described conditions, and the drilling is initiated.

The drill 4 is first fed at the entry feed rate VE from the drill-starting position A to the first intermediate position M1 past the pulled-out position C to thereby form a hole which extends through the entry board 2 into the uppermost printed circuit board 1. The drill 4 is then moved from the intermediate position M1 to the pulled-out position C at the rapid feed rate VR. The chips stuck to the drill 4 are shaken off when it comes out of the entry board 2 and, at the same time, the drill 4 which has heated up during drilling is cooled. During this time, since the entry board 2 is pressed by the pressure foot 5, the position of the entry board 2 does not deviate even if there is a tendency for the entry board 2 to easily deviate. Subsequently, the drill 4 is fed from the pulled-out position C to the second intermediate position M2 at the drilling feed rate VF to effect drilling of the printed circuit boards 1. At this time, since the previously drilled hole serves as a guide for the drill 4, the drill 4 can effect a drilling operation without being bent. Accordingly, the deviation of the position of the hole does not occur. Then, the drill 4 is fed from the intermediate position M2 to the pulled-out position C at the rapid feed rate VR. Subsequently, the drill 4 is fed from the pulled-out position C to the drill end position B at the drilling feed rate VF. When the tip end of the drill 4 reaches the drill end position B, a through-hole is formed in all the stacked printed circuit boards 1. Subsequently, the drill 4 is fed back from the drill end position B to the drill-starting position A at the rapid feed rate VR to complete the drilling of one hole.

The printed circuit boards 1 and the drill 4 are then fed relative to each other in the direction parallel to the upper surface of the printed circuit boards 1 for subsequent drilling.

In the above-described drilling operation, since the entry board 2 is pressed by the pressure foot 5 while one hole is being drilled, the entry board 2 does not deviate and it is, therefore, possible to prevent the wear or bending of the drill 4 due to the deviation of the position of the entry board 4.

Figure 7:
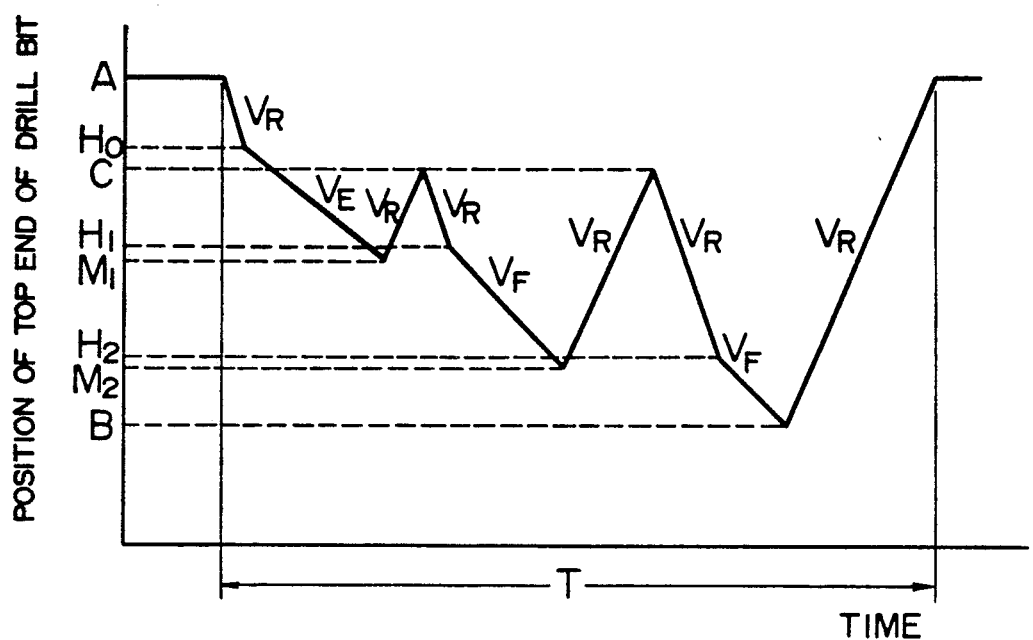
FIG. 7 is a characteristic chart showing the relationship between the position of a drill and the time for the drill to be fed in accordance with a second aspect of the present invention.
Figure 8:
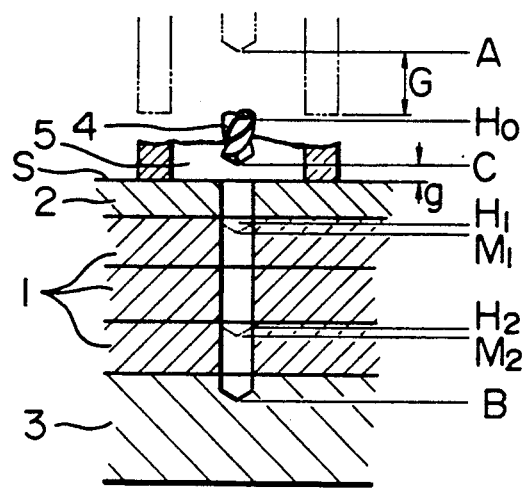
FIG. 8 is a front elevational view in partial cross section of the state of a hole drilled in stacked printed circuit boards and accordance with the second aspect.
Figure 9A:
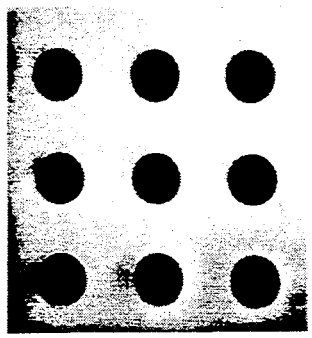
FIG. 9A illustrates the result of drilling of printed circuit boards using the present drilling method, and shows the state of the front face of the uppermost printed circuit board.
Figure 9C:
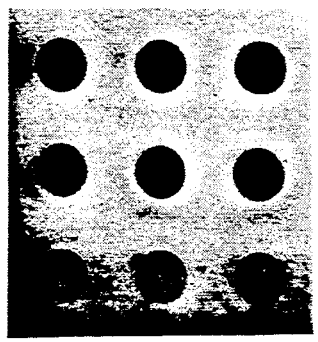
FIG. 9C illustrates the result of drilling of the printed circuit boards, using the present drilling method, and shows the state of the rear face of the lowermost printed circuit board.
Figure 9D:
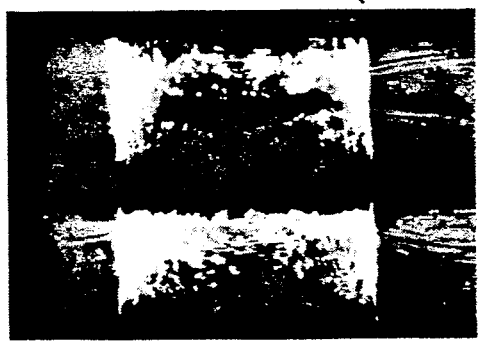
FIG. 9D is an enlarged view of the upper end of the hole shown in FIG. 4B.
Figure 9B:
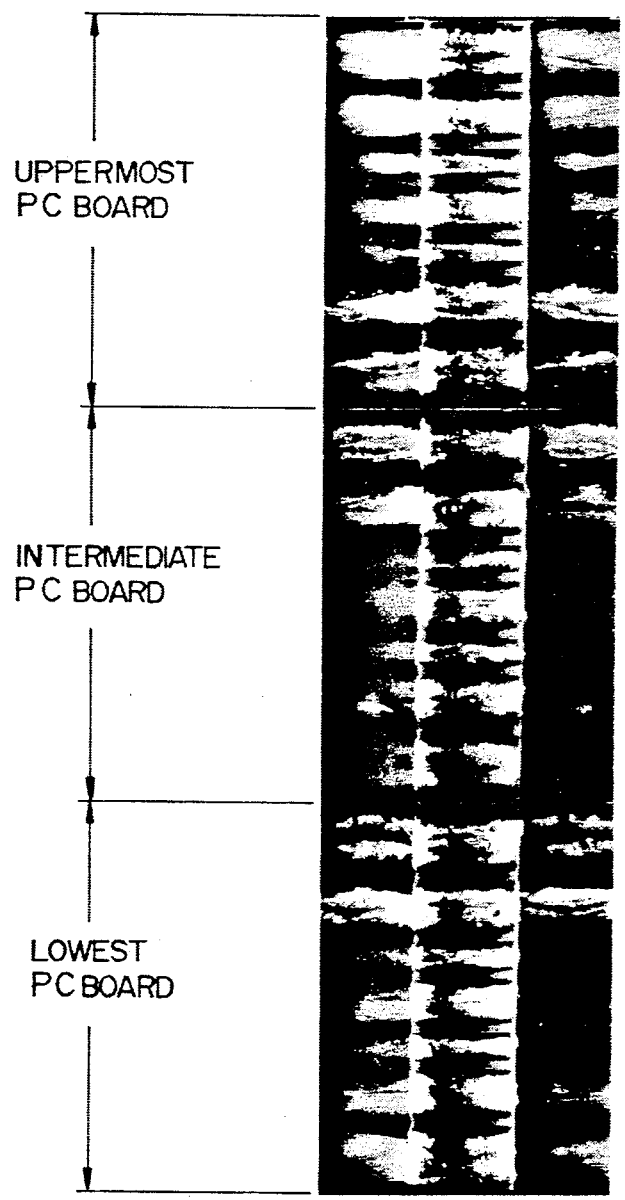
FIG. 9B is a cross-sectional view illustrating the result of drilling of the printed circuit boards using the present drilling method.

FIGS. 7 and 8 show a second embodiment of the present invention. In each of the figures, the same reference numerals and symbols are used to denote the parts which are the same as those shown in FIGS. 5 and 6.

Symbols H0, H1 and H2 represent switchover positions.

The switchover position H: is set at a located slightly higher than the position at which the pressure foot 5 makes contact with the entry board 2. More specifically, the switchover position H0 is 0.01 inches higher than the entry board 2.

The switchover positions H1 and H2 are set at locations which are higher than the adjacent intermediate positions M1 and M2 by predetermined amounts, respectively. More specifically, the switchover positions H1 and H2 are 0.01 inches higher than the intermediate positions M; and M2, respectively.

The other drilling conditions are selected in a manner similar to that used in the above-described embodiment.

First of all, the drill 4 is first fed at the rapid feed rate VR from the drill-starting position A to the first switchover position Ho. When the tip end of the drill 4 reaches the switchover position H:, the feed rate of the drill 4 is switched from the rapid feed VR to the drilling feed rate Vs. Then, the drill 4 is fed from the switchover position H0 to the first intermediate position M1 past the pulled-out position C to thereby form a hole which extends through the entry board 2 into the uppermost printed circuit board 1. The drill 4 is then moved from the intermediate position M1 to the pulled-out position C at the rapid feed rate VR. Thereafter, the drill 4 is fed from the pulled-out position C to the switchover position H1 at the rapid feed rate VR. The chips stuck to the drill 4 are shaken off when it comes out of the entry board 2 and, at the same time, the drill 4 which has heated up during drilling is cooled. During this time, since the entry board 2 is pressed by the pressure foot 5, the position of the entry board 2 does not deviate even if there is a tendency for the entry board 2 to easily deviate. When the tip end of the drill 4 reaches the switchover position H1, the feed rate of the drill 4 is switched from the rapid feed rate VR to the drilling feed rate VF. Subsequently, the drill 4 is fed from the switchover position H1 to the second intermediate position M2 at the drilling feed rate VF to effect drilling of the printed circuit boards 1. At this time, since the previously drilled hole serves as a guide for the drill 4, the drill 4 can effect a drilling operation without being bent. Accordingly, the deviation of the position of the hole does not occur. Then, the drill 4 is fed from the intermediate position M2 to the pulled-out position C at the rapid feed rate VR. Subsequently, the drill 4 is fed from the pulled-out position C to the next switchover position H2 at the drilling feed rate VR. When the tip end of the drill reaches the next switchover position H2, the feed rate of the drill 4 is switched from the rapid feed rate VR to the drilling feed rate Vr. Then, the drill 4 is fed from the switchover position Hz to the drill end position B at the drilling feed rate VF. When the tip end of the drill 4 reaches the drill end position B, a through-hole is formed in all the stacked printed circuit boards 1. Subsequently, the drill 4 is fed back from the drill end position B to the drill-starting position A at the rapid feed rate VR to complete the drilling of one hole.

The printed circuit boards 1 and the drill 4 are then fed relative to each other in the direction parallel to the upper surface of the printed circuit boards 1 for subsequent drilling.

By increasing the number of areas in which the drill 4 is fed at the rapid feed rate VR, drilling time T can be made short compared with that of the first embodiment. If the feed rate between the drill-starting position A and the first switchover position Ho is made higher than the rapid feed rate VR the drilling time T can be made further short.

Each of the above-described embodiments has been described with reference to the example in which the two intermediate positions M1 and M2 are set, but the number of intermediate positions may be increased. In addition, each of the intermediate positions may be formed such that the distances between adjacent intermediate positions become smaller in the direction of the depth of a hole.

As described above, in each of the embodiments of the present invention, the pressure foot 5 starts to press the printed circuit board 1 immediately before the drill 4 penetrates into the entry board 2 and continues to press them even after the drill 4 reaches the drill end position B, coming out of the entry board 2. Accordingly, it is possible to prevent lifting or deviation of the entry board 2 or each printed circuit board 1 and hence to effect high precision drilling.

Each of the embodiments has been described with reference to the example in which drilling is effected with the entry board 2 overlying the stacked printed circuit boards 1. As a matter of course, drilling may be carried out with no entry board 2 overlying the stacked printed circuit boards 1.

Example 1

Work

Printed circuit board (Glass epoxy 8 layers) : 0.063 in. in thickness

Entry board (Entry material) : 0.006 in. in thickness

Back-up board (Back-up material) : 0.063 in. in thickness

Hole : 0.016 in. in diameter

Drill feed rates

Speed of rotation of drill : 70 krpm
Entry feed rate (VE) : 80 ipm
Drilling feed rate (VF) : 50 ipm
Rapid feed rate (VR) : 1000 ipm
Position
Switchover position (Ho) : 0.01 in. from top of entry board
Switchover positions (H1 . . . Hn): 0.01 in. above the intermediate positions M1 . . . Mn, respectively
Pulled-out position (C) : 0.04 in. from top of entry board
Intermediate position (M1) : 0.07 in. from top of entry board
Intermediate position (M2) : 0.05 in. from intermediate position M1
Intermediate positions (M3 . . . Mn) : 0.03 in. from intermediate positions immediately above them, respectively
Drilling end position (B) : 0.235 in. from top of entry board Gap
G : 0.08 inches
g : 0.04 inches The results obtained by drilling under the above drilling conditions are shown in FIGS. 9A, 9B, 9C and 9D, respectively. As can be seen from the figures, the following remarkable advantages can be achieved in industrial applications:

1. The positional accuracy of the hole is greatly improved. (Refer to FIGS. 9A and 9C.)
2. The amounts of smears generated on the inner circumferential surface of the hole is greatly reduced. (Refer to FIG. 9B.)
3. The deformation of the copper foil of the drilled board is reduced. (Refer to FIG. 9D.)
4. The thermal wear of the drill is reduced and, therefore, the life of the drill can be extended.

FIGS. 10A, 10B, 11 and 12 show comparisons between the above results and those obtained by a conventional drilling method.

Figure 10A:
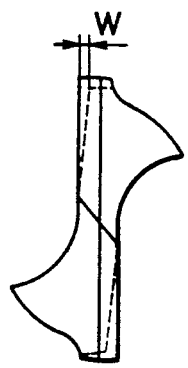
FIG. 10A is a front elevational view showing the tip end of the drill.
Figure 10B:
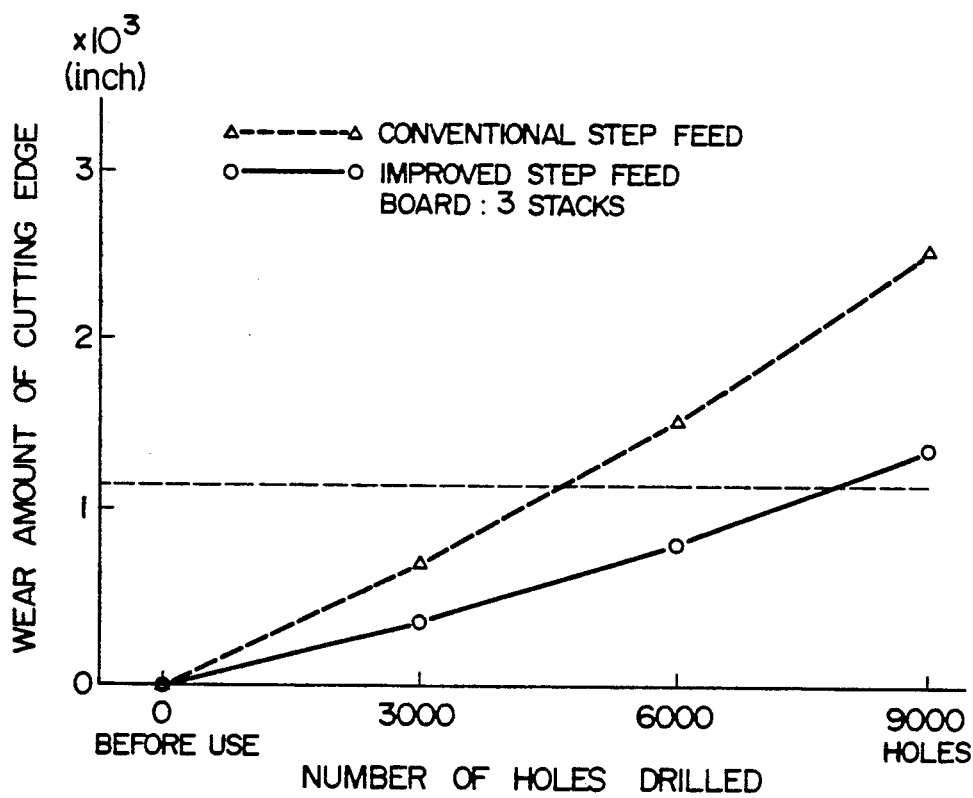
FIG. 10B is a characteristic chart which serves to compare the drill bit wears in the conventional drilling method and in the present invention.
Figure 11:
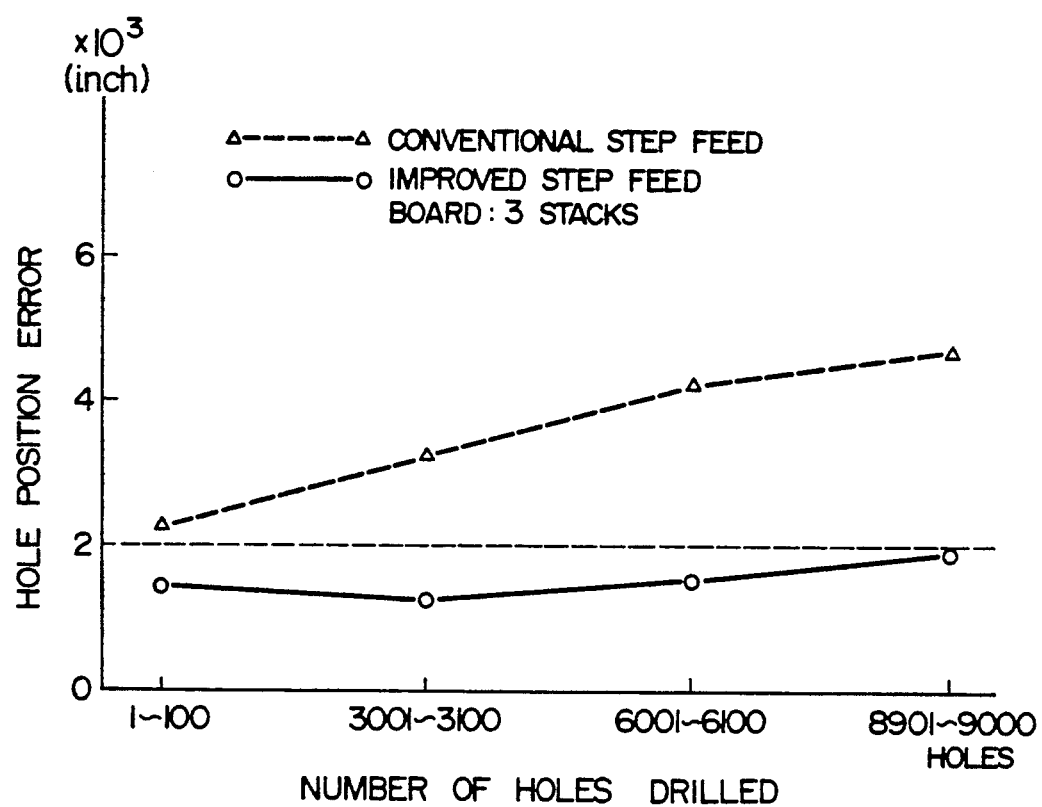
FIG. 11 is a characteristic chart which serves to compare the positional accuracy of a hole in the conventional drilling method and that of a hole in the present invention.
Figure 12:
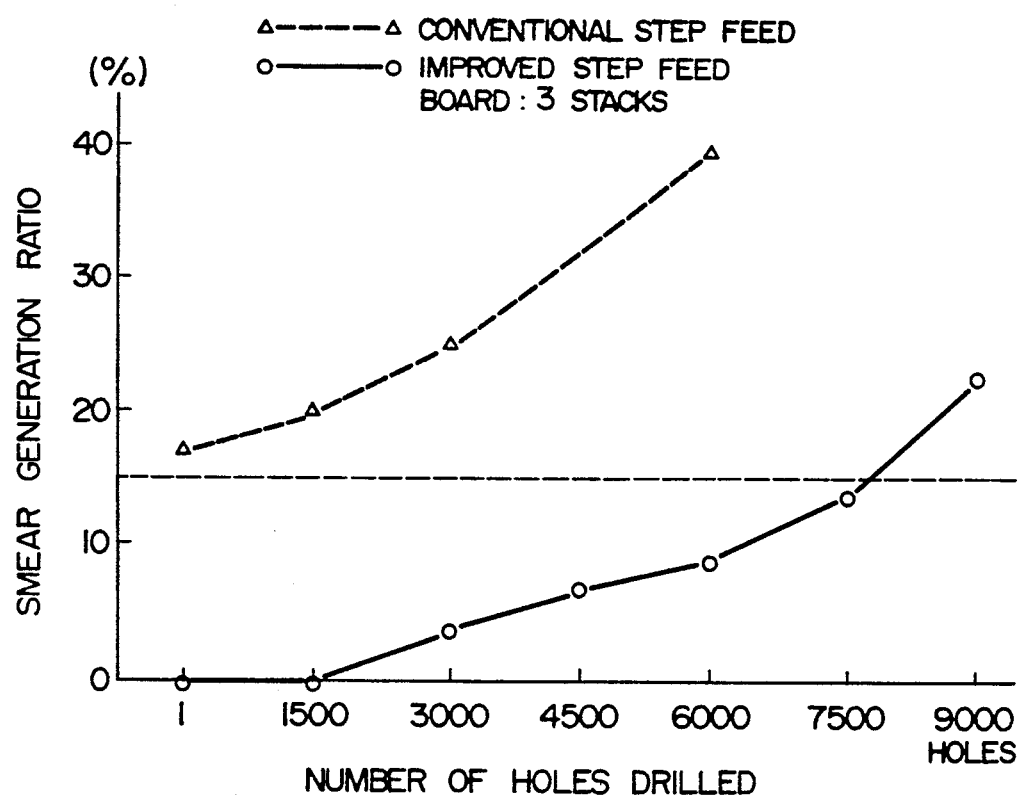
FIG. 12 is a characteristic chart which serves to compare the smear generation ratios in the conventional drilling method and in the present invention.

FIG. 10B shows a comparison between the amounts of wear of the tip ends of drills used in the present drilling method and in the conventional one as shown in FIG. 10A. As can be seen from FIG. 10B, in the case of drilling of 9,000 holes, the present drilling method achieves an about 60% reduction in the amount of drill bit wear over the conventional drilling method. As shown in FIG. 11, the positional accuracy of the drilled hole in the present drilling method is twice as high as that in the conventional drilling method. In addition, as shown in FIG. 12, the smear generation ratio in the present drilling method is not greater than 25% of that in the conventional drilling method.

What is claimed is:

1. A method for drilling a hole in a workpiece, comprising the steps of:
   moving a pressure foot associated with a drill into contact with the workpiece, and
   moving a drill bit associated with the drill from a drill-starting position in to the workpiece, toward the drill-starting position and again into the workpiece while maintaining the pressure foot in constant contact with the workpiece, wherein the drill bit movement produces a hole with a high aspect ratio of at least 8 as defined by the length of the hole to the hole diameter.

2. A method for drilling a hole according to claim 1, wherein the workpiece is a thin, flexible material.

3. A method of drilling a hole in a workpiece of a thin, flexible material, comprising the steps of:
   moving a pressure foot associated with a drill into contact with the workpiece, and
   moving a drill bit associated with the drill from a drill-starting position in to the workpiece, toward the drill-starting position and again into the workpiece while maintaining the pressure foot in constant contact with the workpiece, wherein the drill bit movement produces a hole with a high aspect ratio of at least 8 as defined by the length of the hole to the hole diameter.

4. Method for drilling a hole in a workpiece comprising at least one printed circuit board, comprising the steps of:
   moving a pressure foot associated with a drill into contact with the workpiece, and
   moving a drill bit associated with the drill form a drill-starting position in to the workpiece, toward the drill-starting position and again into the workpiece while maintaining the pressure foot in constant contact with the workpiece, and wherein the drill bit movement produces a high aspect ratio hole of at least 8 as defined by the length of the hole to the hole diameter.

5. A method for drilling a hole according to claim 4, wherein the workpiece further comprises an entry board on one side of the at least one printed circuit board.

6. A method for drilling a hole according to claim 4, wherein the workpiece further comprises a back-up board on one side of the at least one printed circuit board.

7. A method for drilling a hole according to claim 6, wherein the workpiece further comprises an entry board on an opposite side of the at least one printed circuit board.

8. A method for drilling a high aspect ratio hole of at least 8 as defined by the length of the hole to the hole diameter in an object, comprising the steps of:
   moving a pressure foot associated with a drill from a drill-start position out of contact with the object so that the drill is moved to the pulled-out position in which the pressure foot but not the drill exerts pressure on the object;
   moving the drill into the object at an entry feed rate to initiate drilling to a first intermediate position on the object while maintaining the pressure exerted by the pressure foot;
   moving the drill to a pulled-out position at a feed rate which is higher than the entry feed rate while maintaining the pressure exerted by the pressure foot; and
   moving the drill to a second intermediate position on the object at a drilling rate lower than the rapid feed rate while maintaining the pressure exerted by the pressure foot.

9. A method according to claim 8, wherein the object comprises an entry board, a back-up board and at least one printed circuit board between the entry board and the back-up board.

10. A method for drilling a high aspect ratio hole of at least 8 as defined by the length of the hole to the hole diameter in stacked circuit boards, comprising:
    moving a pressure foot associated with a drill from a drill-start position out of contact with said circuit boards at a rapid feed rate to a pulled-out position in which said pressure foot is in pressure contact with said stacked circuit boards and said drill is located just out of contact therewith;

moving said drill into said stacked circuit boards at an entry feed rate, which is lower than the rapid feed rate to initiate drilling at an intermediate portion of a first circuit board of said stacked circuit boards to be contacted by said drill while maintaining the pressure contact by the pressure foot;

moving said drill from the intermediate portion of said first circuit board at a rapid feed rate to the pulled-out position and then to a switchover position adjacent the intermediate portion while maintaining the pressure contact by the pressure foot; and moving said drill to another intermediate position of another circuit board of said stacked circuit boards at a drilling feed rate lower than the rapid feed rate while maintaining the pressure contact by the pressure foot.

* * * * *